US010290632B2

(12) United States Patent
Scott et al.

(10) Patent No.: US 10,290,632 B2
(45) Date of Patent: May 14, 2019

(54) AC-COUPLED SWITCH AND METAL CAPACITOR STRUCTURE FOR NANOMETER OR LOW METAL LAYER COUNT PROCESSES

(71) Applicant: Qorvo US, Inc., Greensboro, NC (US)

(72) Inventors: Baker Scott, San Jose, CA (US);
George Maxim, Saratoga, CA (US);
Dirk Robert Walter Leipold, San Jose, CA (US); Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/650,239

(22) Filed: Jul. 14, 2017

(65) Prior Publication Data

US 2018/0145068 A1  May 24, 2018

Related U.S. Application Data

(60) Provisional application No. 62/424,622, filed on Nov. 21, 2016.

(51) Int. Cl.
*H01L 27/108* (2006.01)
*H01L 27/06* (2006.01)
*H01L 49/02* (2006.01)
*H01L 23/535* (2006.01)

(52) U.S. Cl.
CPC ........ *H01L 27/0629* (2013.01); *H01L 23/535* (2013.01); *H01L 28/60* (2013.01)

(58) Field of Classification Search
CPC .... H01L 27/0629; H01L 23/535; H01L 28/60
USPC ........................................................ 257/306
See application file for complete search history.

(56) References Cited

U.S. PATENT DOCUMENTS

| 2002/0127753 A1* | 9/2002 | Jang ................. H01L 27/1214 438/29 |
| 2011/0261500 A1 | 10/2011 | Parris et al. |
| 2017/0271257 A1* | 9/2017 | Zhu ..................... H01L 23/528 |

* cited by examiner

*Primary Examiner* — Tu-Tu V Ho
(74) *Attorney, Agent, or Firm* — Withrow & Terranova, P.L.L.C.

(57) ABSTRACT

Alternating Current (AC)-coupled switch and metal capacitor structures for nanometer or low metal layer count processes are provided. According to one aspect of the present disclosure, a switch and capacitor structure comprises a substrate comprising a device region with a Field Effect Transistor (FET) formed therein, the FET having a source terminal comprising a structure in a first metal layer and a drain terminal comprising a structure in the first metal layer, and a capacitor comprising a first plate and a second plate, the first plate comprising a structure in a second metal layer, the second metal layer being above the first metal layer, the structure of the first plate being electrically connected to the structure of the drain terminal, and the second plate comprising a structure in the second metal layer, the structure of the first plate spaced from the structure of the second plate.

16 Claims, 13 Drawing Sheets

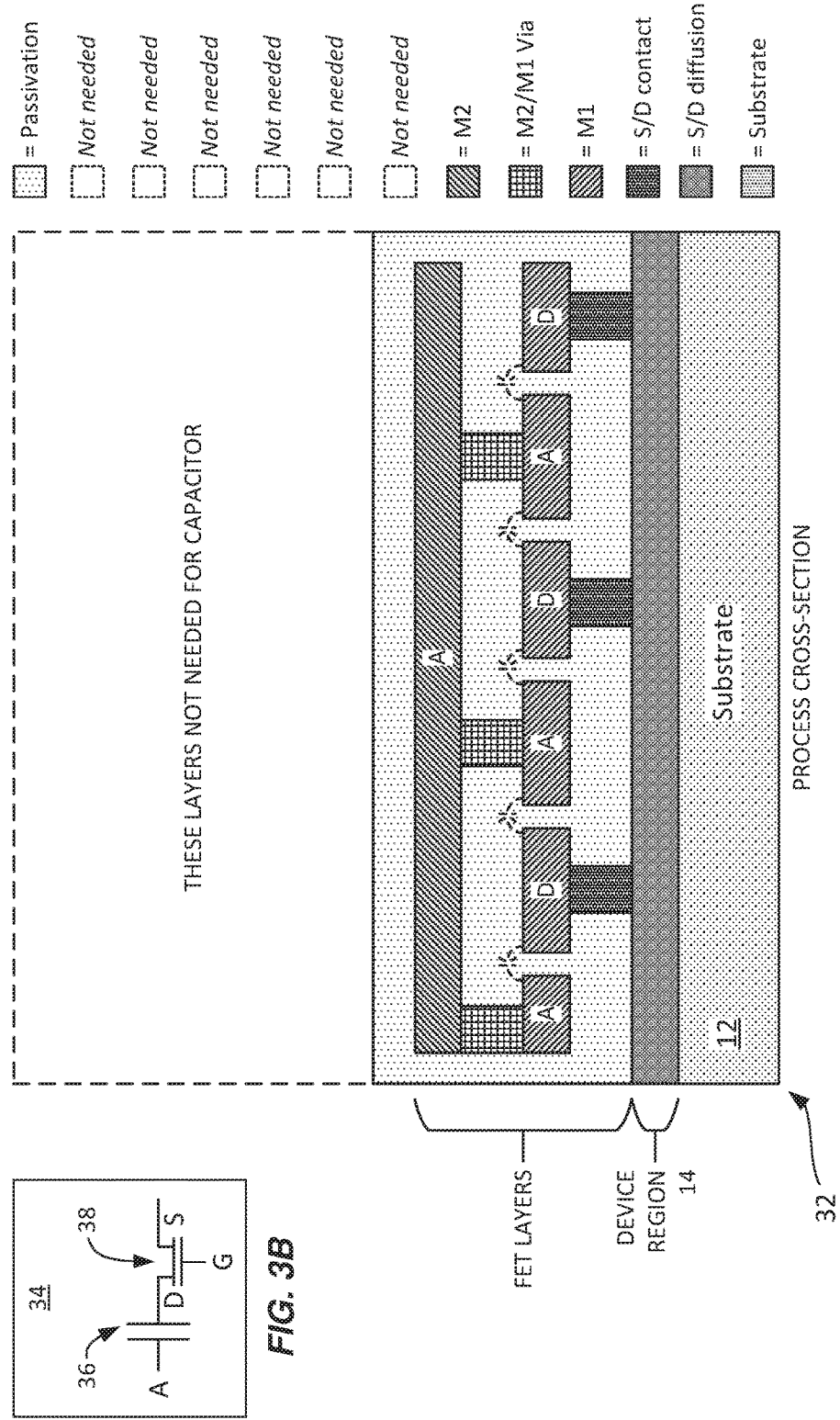

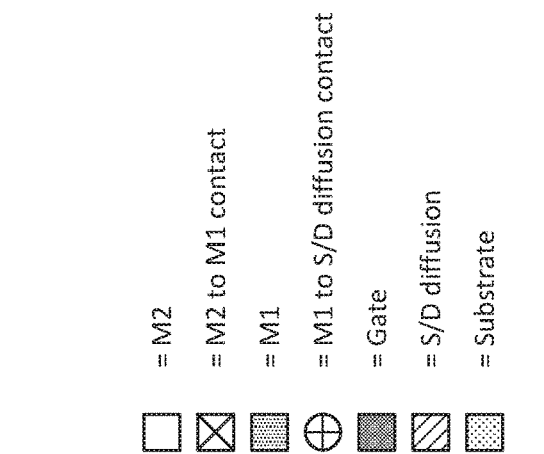
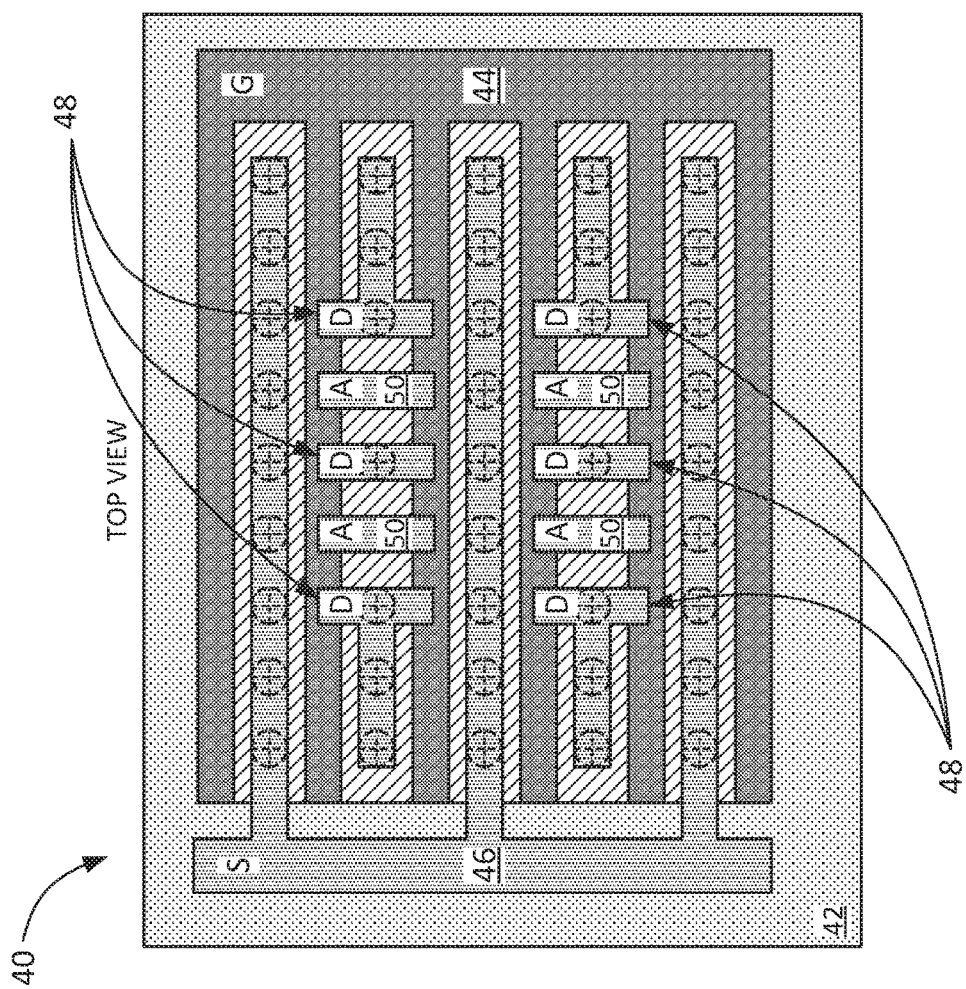
FIG. 4A

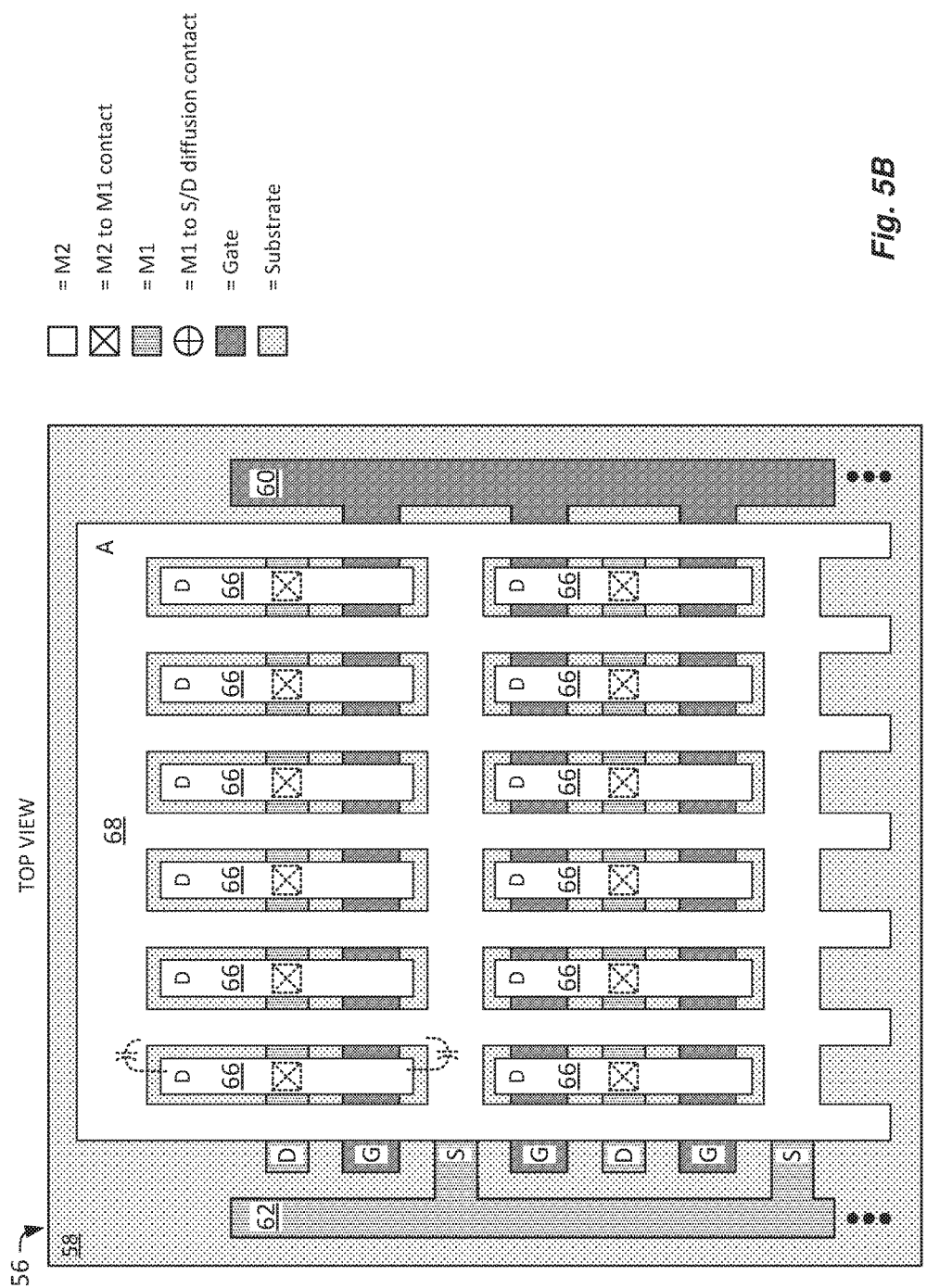

AC-COUPLED SWITCH AND METAL CAPACITOR STRUCTURE FOR NANOMETER OR LOW METAL LAYER COUNT PROCESSES

RELATED APPLICATIONS

This application claims the benefit of provisional patent application Ser. No. 62/424,622 filed Nov. 21, 2016, the disclosure of which is hereby incorporated herein by reference in its entirety.

TECHNICAL FIELD

The present disclosure relates to a semiconductor device and a process for making the same, and more particularly to a semiconductor device having an Alternating Current (AC)-coupled switch and metal capacitor structure for nanometer-scale or low metal layer count processes.

BACKGROUND

Many modern Complementary Metal Oxide Semiconductor (CMOS) processes have a large number of metal layers (e.g., 8-18 layers) for use later in process, i.e., the metal layers are higher and higher, e.g., farther away from the substrate.

FIG. 1A illustrates a cross-sectional view of a conventional CMOS device 10 constructed according to a conventional wafer process. In the example shown in FIG. 1A, the wafer process supports five metal layers, named "M1" through "M5" above the substrate 12. Within the substrate 12 a Field Effect Transistor (FET) may be built within a region of the substrate 12 referred to as the "device region" 14 using source/drain (S/D) diffusion layers 16. An M1 layer 18 may be connected to the S/D diffusion layer 16 via one or more S/D contacts 20. An M2 layer 22 may be connected to the M1 layer 18 through one more M2/M1 vias 24, which may be located over the S/D contact 20.

The S/D diffusion layer 16 is within a portion of the substrate 12 that is referred to herein as the "device region" 14, because semiconducting devices are constructed within this layer, e.g., one or more source diffusions are separated from one or more drain diffusions by a gate (not shown in the cross-section in FIG. 1A). Other layers—namely, the M2 layer 22, the M2/M1 via 24, the M1 layer 18, and the S/D contact 20—are hereinafter referred to as "FET connection layers 20," or simply "FET layers 20," because FETs are constructed using conductive structures within these layers. The higher layers shown in FIG. 1A—an M5 layer, an M5/M4 via, an M4 layer 28, an M4/M3 via, an M3 layer 26, and an M3/M2 via—are not used to create FETs but are instead used for chip-wide interconnects and can also be used to create capacitor structures. These layers are hereinafter referred to as "routing/capacitor layers," "routing layers," or simply "routing metal."

In the example illustrated in FIG. 1A, a capacitor has been formed using routing/capacitor layers, i.e., from the M3 layer 26 (which forms the bottom plate of the capacitor) and the M4 layer 28 (which forms the top plate of the capacitor) separated by an oxide/passivation layer. Capacitors having this structure are referred to as Metal-Insulator-Metal (MIM) capacitors. The M5 layer, M5/M4 via, and M4/M3 via provide electrical contact to the capacitor plate structure created using the M3 layer 26 and the M4 layer 28. Thus, FIG. 1A illustrates the point that conventional CMOS processes use FET layers to create FETs and use routing layers for interconnects and to create capacitors.

However, while having a large number of metal layers simplifies routing by providing additional interconnect layers, this flexibility comes at a cost—namely, the expense of the additional material and process costs required to provide those layers.

As the CMOS device 10 moves for nanometer feature sizes, the lateral distance between the metal layers becomes small enough such that the lateral capacitance has significant capacitance density. As a result of this reduction in feature size, a different capacitor structure becomes possible. An example is shown in FIG. 1B.

FIG. 1B illustrates a cross-sectional view of another conventional CMOS device 30 constructed according to a conventional wafer process. In the example shown in FIG. 1B, a "stack" of metal is constructed of routing layers (i.e., the M5 layer, M5/M4 via, M4 layer 28, M4/M3 via, and M3 layer 26) to form vertical plates of a capacitor. Capacitors having this structure are referred to as Metal-Oxide-Metal (MOM) capacitors. In the example shown in FIG. 1B, there are six stacks, labeled S1 through S6. Odd-numbered stacks are connected to each other to form one plate of the capacitor, and even-numbered stacks are connected to each other form the other plate of the capacitor. However, many foundry process design kit-available MOM devices have poor performance due to design restrictions to accommodate process limitations. Moreover, not all processes have a large number of metal layers; in such cases, the traditional lateral MOM capacitance structure leads to poor performance.

FIGS. 2A and 2B illustrate two types of Radio Frequency (RF) switches. RF switches are commonly constructed of several FETs connected in series. FIG. 2A shows a Direct Current (DC)-coupled switch, in which the FETs are directly connected to each other, and FIG. 2B shows one stage of an AC-coupled switch, in which the FETs are connected to each other via capacitors, each labeled "CAP" in FIG. 2B. Both types of switches use bias networks to provide proper operating conditions to each FET in series, but DC-coupled switches, such as the one in FIG. 2A, typically require a charge pump or other voltage-shifting circuit to provide the proper DC bias required by each stage, while AC-coupled switches do not.

For example, to turn off the stage of the AC-coupled switch in FIG. 2B it is sufficient to provide 0 volts to the gate of the FET and to provide the supply voltage V volts to the source and drain of the FET. In contrast, each FET of the DC-coupled switch in FIG. 2A must be provided with a different bias voltage depending upon the position of the FET in the chain of FETs. As a result, AC-coupled switches require less bias circuitry, which reduces device complexity. Since charge pumps or similar circuits needed by DC-coupled switches typically occupy significant die space and require multiple, large capacitor structures, AC-coupled switches may be made with a smaller die area, which reduces wafer costs.

There are also disadvantages to AC-coupled switches, however, especially for RF switches that are used in receive, transmit, and transceiver signal paths. In the uplink carrier aggregation and ultra-high bandwidth and 5 Gigahertz (GHz) bands, the signal at the low-noise amplifier input can become moderately large. In such a case, it is necessary to stack multiple FETs, which distributes the input voltage across multiple FETs, thus avoiding subjecting any one FET to overvoltage conditions. In the receive case, the switch Insertion Loss (IL) goes directly into noise figure budget, thus there is a need to minimize switch IL. For example, a typical 45 nanometer silicon-on-insulator CMOS has a figure of merit of 84 femtoseconds (fs) and can get very low IL of about 0.05 Decibels (dB). MIM capacitors are expensive (extra masks), so metal capacitors become attractive. Thus, AC-coupled RF switches require many stages, with each stage having one or more metal capacitors.

The conventional structures illustrated in FIGS. 1A and 1B, and the wafer processes that are used to create them, suffer distinct disadvantages when used for AC-coupled switches and other circuits where FETs are connected in series via capacitors: the connections between one stage and the next involve creating conductive paths from the FET layers up to the routing metal layers and back down to the FET layers 20 for the next amplification stage. This up-and-down routing is repeated for each stage. Thus, AC-coupled switches constructed according to conventional processes, such as those illustrated in FIGS. 1A and 1B, require additional mask layers for not only the capacitor structures between stages but also for making the routing connections from the FET layer to the routing metal layers and back again as well as for other connections. As a result, high metal layer count processes are used to make AC-coupled switches, even when nanometer-scale, low metal layer processes are available.

Thus, there is a need for AC-coupled switch and metal capacitor structures for nanometer-scale or low metal layer count processes.

SUMMARY

The present disclosure relates to an AC-coupled FET switch and capacitor-FET combination structure realized directly in the FET layer without using the routing metal layers. In the embodiments disclosed herein, a metal interconnect capacitance is realized in series with the FET. The structures disclosed herein can be implemented in processes having low metal layer counts, can be placed under input/output pads, resulting in lower area, and come at no additional processing cost. Moreover, the structures of the present disclosure have large breakdown voltages (e.g., 200 V) and for most applications do not need several capacitances in series to withstand the maximum operating voltage, potentially resulting in a further reduction of circuit complexity, size, and cost.

According to one aspect of the present disclosure, a switch and capacitor structure comprises a substrate comprising a device region with a FET formed therein, the FET having a source terminal comprising a structure in a first metal layer and a drain terminal comprising a structure in the first metal layer, and a capacitor comprising a first plate and a second plate, the first plate comprising a structure in a second metal layer, the second layer being above the first metal layer, the structure of the first plate being electrically connected to the structure of the drain terminal, and the second plate comprising a structure in the second metal layer, the structure of the first plate spaced from the structure of the second plate.

In one embodiment, the first and second metal layers are the metal layers that are closest to the substrate.

In one embodiment, the structure of the first plate comprises a first plurality of parallel conductors in the second metal layer and the structure of the second plate comprises a second plurality of parallel conductors in the second metal layer interdigitated between the first plurality of parallel conductors in the second layer.

In one embodiment, wherein the structure of the source terminal comprises a third plurality of parallel conductors in the first metal layer.

In one embodiment, wherein an orientation of the third plurality of parallel conductors is different from an orientation of the first and second pluralities of parallel conductors.

In one embodiment, wherein the orientation of the third plurality of parallel conductors is essentially perpendicular to the orientation of the first and second pluralities of parallel conductors.

In one embodiment, wherein the structure of the second plate comprises a conductive loop that surrounds the structure of the first plate.

In one embodiment, wherein the structure of the second plate comprises a plurality of conductive loops, each loop surrounding a portion of the structure of the first plate, the portions of the structure of the first plate being electrically connected to each other.

In one embodiment, wherein the structure of the drain terminal further comprises one or more electrically conductive vias that extend above or below the first metal layer but that do not make electrical contact with another conductive layer or the substrate.

In one embodiment, wherein at least one of the structure of the first plate and the structure of the second plate comprises one or more electrically conductive vias that extend above or below the second metal layer but that do not make electrical contact with another conductive layer or the substrate.

In one embodiment, wherein at least one of the first and second plates is electrically coupled to a structure in a third metal layer, the third layer being above the second metal layer.

In one embodiment, wherein the first plate is electrically coupled to a structure in a third metal layer, the third metal layer being above the second metal layer and wherein the second plate is electrically coupled to a structure in the third metal layer.

According to another aspect of the present disclosure, a switch and metal capacitor structure comprises a FET having a source terminal comprising a structure in a first metal layer and a drain terminal comprising a structure in the first metal layer, and a capacitor comprising a first plate and a second plate, the first plate comprising at least a portion of the structure of the drain terminal in the first metal layer and the second plate comprising a structure in a second metal layer, the second metal layer being above the first metal layer, the structure of the second plate spaced from the structure of the drain terminal.

In one embodiment, the first and second metal layers are the metal layers that are closest to the substrate.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure and, together with the description, serve to explain the principles of the disclosure.

FIG. 3A illustrates a cross-sectional view of an exemplary AC-coupled switch and metal capacitor structure according to an embodiment of the present disclosure, the circuit diagram of which is illustrated in FIG. 3B.

FIGS. 4A through 4C are top views illustrating in detail an AC-coupled switch and metal capacitor structure according to an embodiment of the present disclosure.

FIGS. 5A and 5B are top views illustrating in detail an AC-coupled switch and metal capacitor structure according to another embodiment of the present disclosure.

DETAILED DESCRIPTION

Figure 1A:
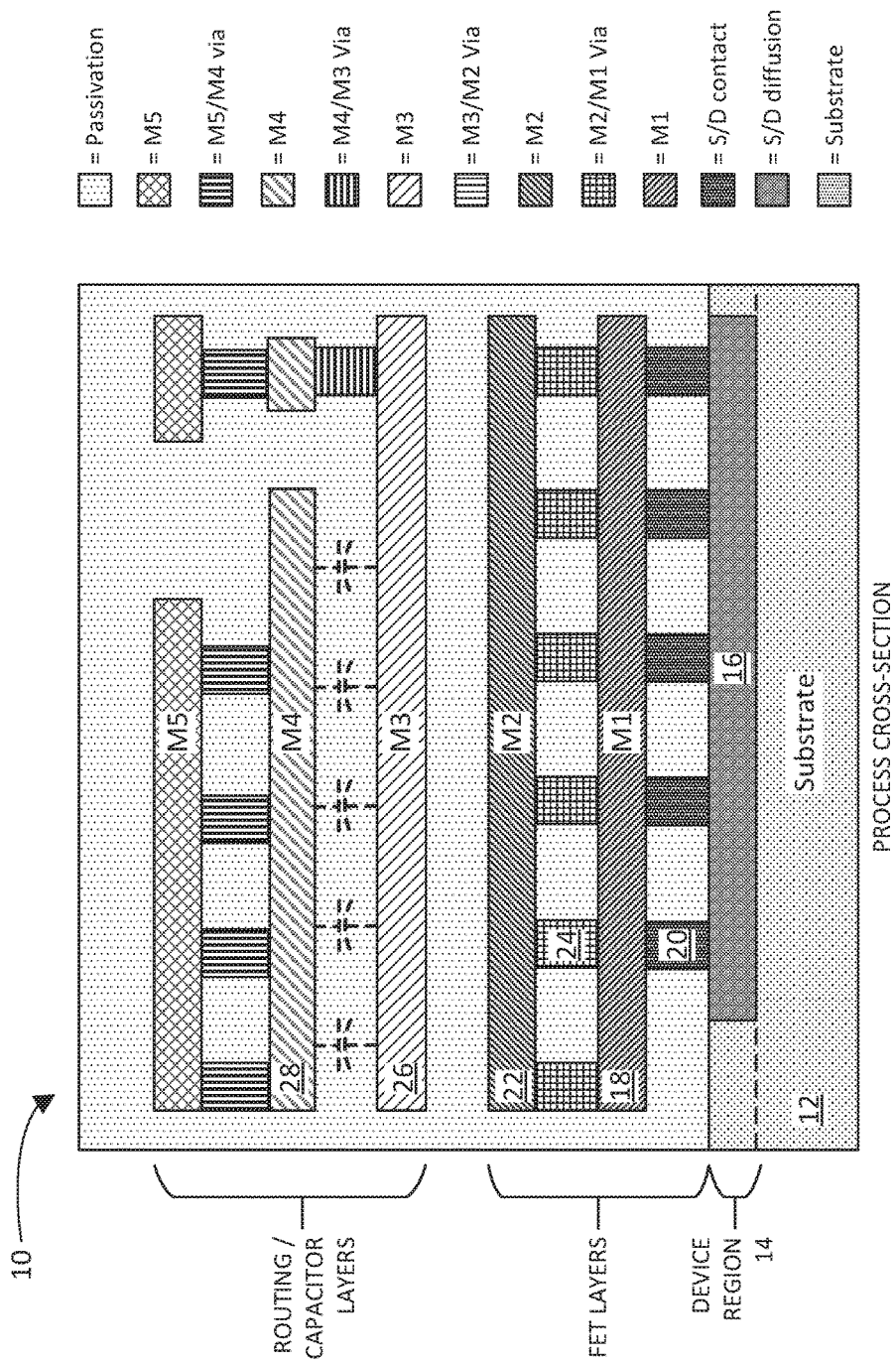
FIG. 1A illustrates a cross-sectional view of a conventional CMOS device constructed according to a conventional wafer process.
Figure 1B:
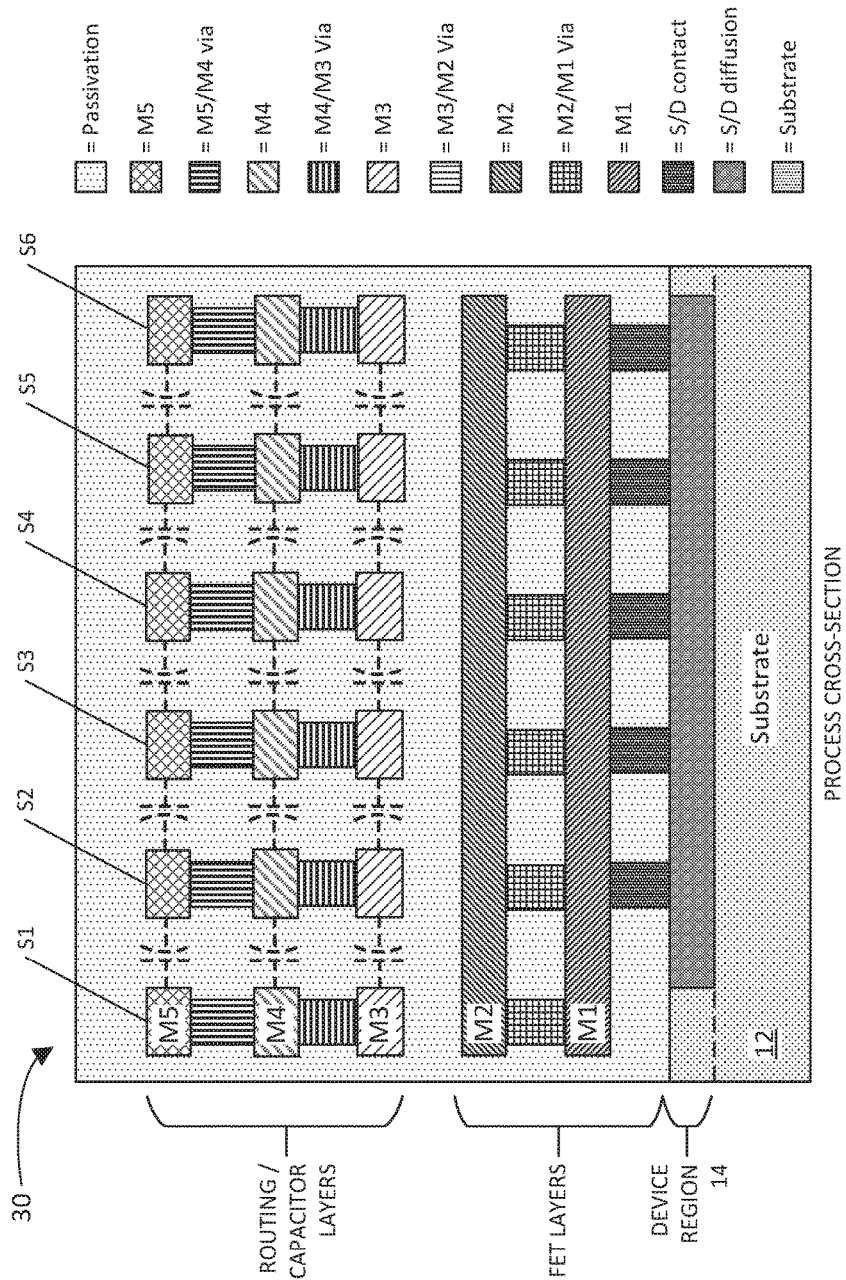
FIG. 1B illustrates a cross-sectional view of another conventional CMOS device constructed according to a conventional wafer process.
Figure 2A:
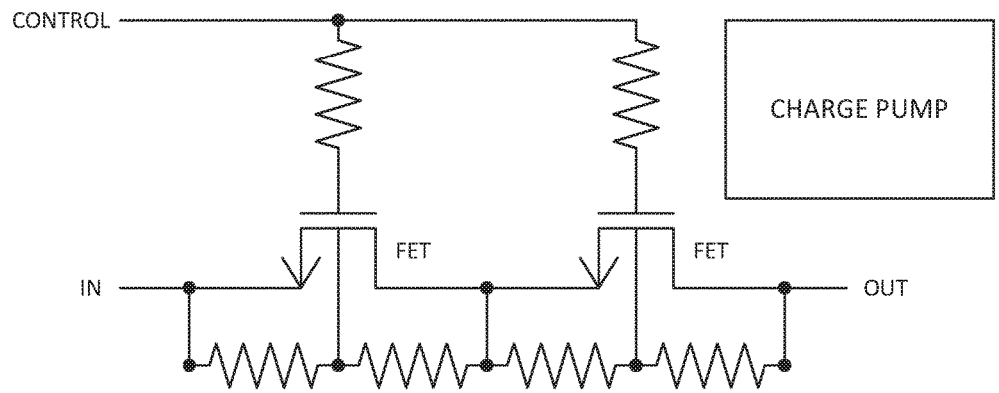
FIG. 2A illustrates a schematic diagram of a conventional DC-coupled switch.
Figure 2B:
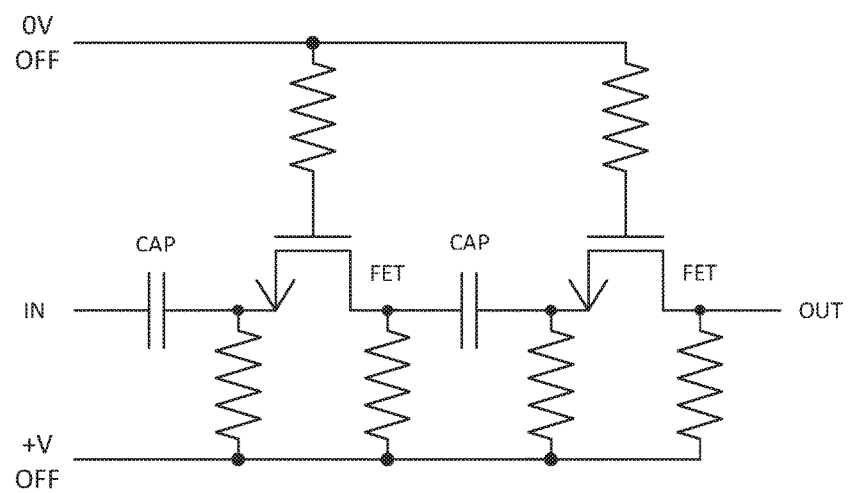
FIG. 2B illustrates a schematic diagram of a conventional AC-coupled switch.

AC-coupled switches, such as the one shown in FIG. 2B, have been avoided in the past because of their larger occupied area. Most RF processes offer MIM capacitors at an extra cost (extra mask steps). Foundries do not allow them to be placed under input/output pads or on top of FET devices for production runs. MIM capacitors have moderate breakdown voltages (e.g., 32 V), requiring high-voltage applications to connect multiple capacitors in series, resulting in a much larger device area.

The present disclosure relates to an AC-coupled FET switch and capacitor FET combination structure realized directly in the FET device interconnect layer instead of in the higher-level metal layers conventionally used. In some embodiments disclosed herein, the drain and/or source metal fingers are broken into multiple parallel "micro-fingers," some of which are connected to the FET diffusions and some of which are connected to the upper metal layer levels, resulting in a metal interconnect capacitance that is realized in series with the FET. The MOM capacitors created in this manner are very efficient in nanometer CMOS: they get similar capacitance density (2 fF/µm2), but they do not need an extra mask. In addition, the MOM capacitors created according to the embodiments disclosed herein have much larger breakdown voltages (e.g., 200 V), which means that most applications do not need several capacitances in series to withstand the maximum operating voltage. This can be valuable for the antenna control solutions in which signals routinely are above 84 V.

The structures disclosed herein are useful to implement AC-coupled switch multiplexers having bipolar signal control, and can also be used in programmable array capacitance/capacitive digital-to-analog converter circuits. The ratio of ON capacitance to OFF capacitance ($C_{ON}/C_{OFF}$) depends on the number of layers used and/or the area of the FET device. Such a structure can be placed under input/output pads, resulting in lower area, and it comes at no additional processing cost.

In one embodiment, the present disclosure provides a resolution to the issue of excessive insertion loss in the band select switch in front of the low-noise amplifier. It enables the use of the 45 nanometer FET switch (single device switch). A FET metal capacitance combination allows bipolar switch control with a larger maximum swing capability out of a single FET switch. It can result in lower insertion loss and thus better overall noise figure performance.

FIG. 3A illustrates a cross-sectional view 32 of an exemplary switch and metal capacitor structure (referred to herein as simply "the cross-section 32") according to an embodiment of the present disclosure, which may be used to create an AC-coupled switch, the circuit diagram of which is illustrated in FIG. 3B. In the embodiment illustrated in FIG. 3A, the cross-section 32 shows a portion of a circuit 34 having a capacitor 36 connected in series with a FET switch 38. In the embodiment illustrated in FIG. 3A, the substrate 12 has the device region 14 in which the FET switch 38 is formed. The FET switch 38 has a source terminal S, a drain terminal D, and a gate terminal G. The capacitor 36 has one terminal connected to the FET source terminal S; the other terminal of the capacitor is labeled A. In the embodiment illustrated in FIG. 3A, the two plates of the capacitor 36 (node A and node D) are formed using the first metal layer M1, and the dielectric between node A and node D is comprised of the passivation layer or other suitable material. FIG. 3A illustrates the point that the capacitor 36 is constructed using FET layers, i.e., the M1 layer (or the M1 and M2 layers) rather than with device interconnect layers as conventionally used. More details about this structure will now be described with reference to FIGS. 4A, 4B, and 4C.

Figure 4B:
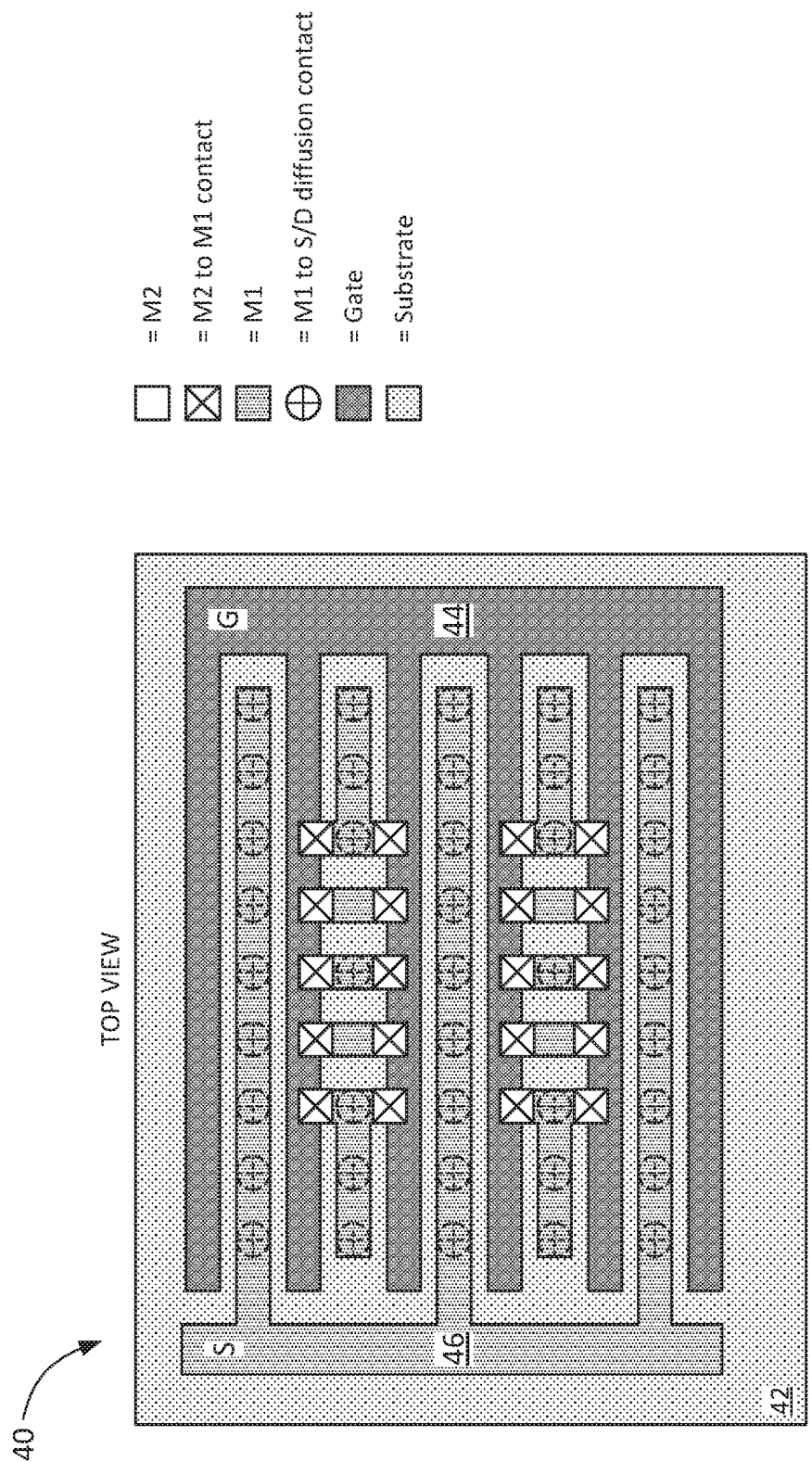
Figure 4C:
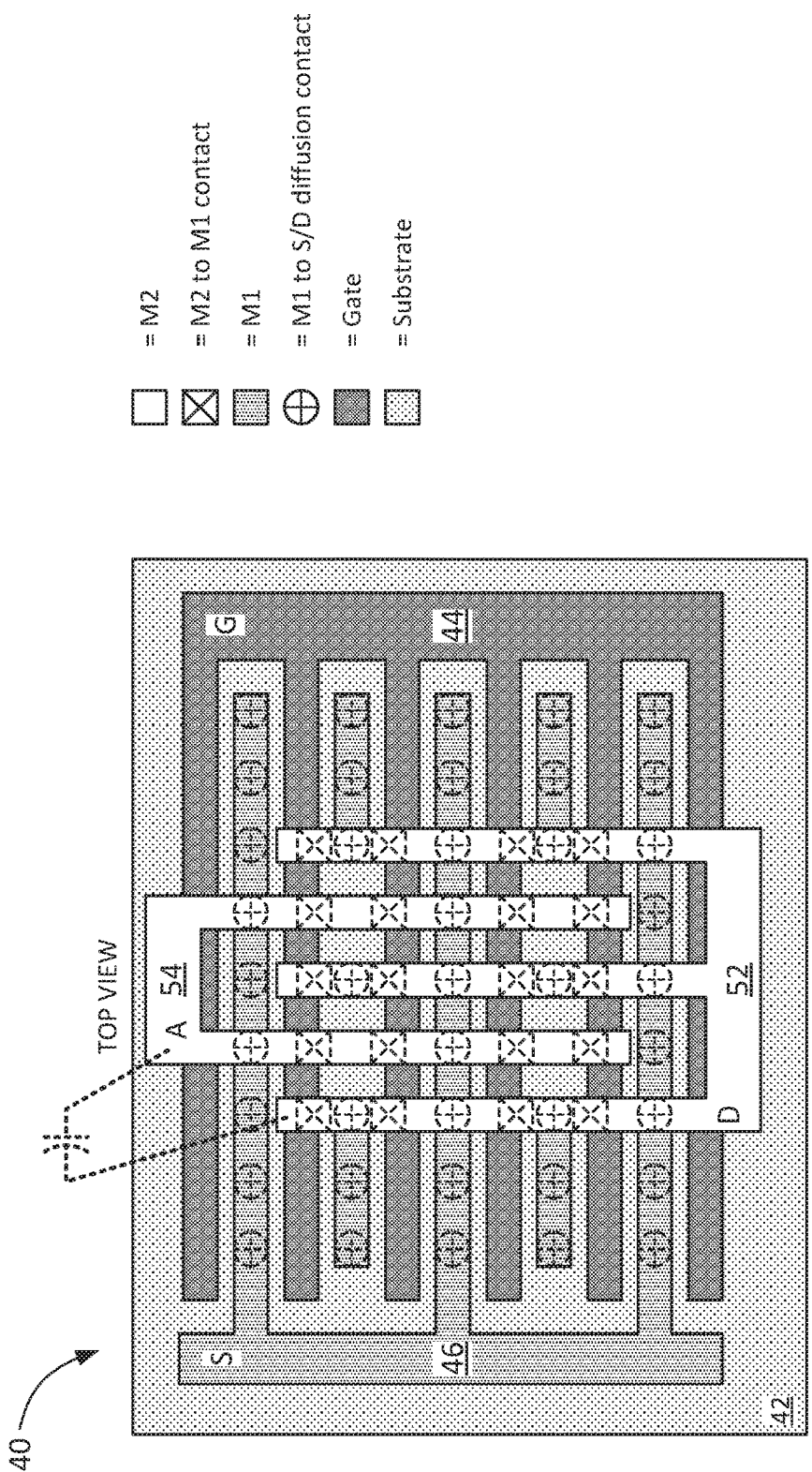

FIGS. 4A through 4C are top views illustrating in detail a switch and metal capacitor structure according to an embodiment of the present disclosure. FIGS. 4A through 4C may also represent the stages of construction that might be used to construct an exemplary AC-coupled switch, the circuit diagram of which is shown in FIG. 3B.

FIG. 4A shows a top view of a portion of an exemplary switch and metal capacitor structure 40 built on a substrate 42. (Alternatively, it could be said that FIG. 4A shows the switch and metal capacitor structure 40, partially constructed.) In one embodiment, the substrate 42 may comprise a doped or undoped semiconductor substrate, such as, but not limited to, Silicon, Gallium Arsenide, or other III-V semiconductor materials.

In the embodiment illustrated in FIG. 4A, a multi-fingered gate 44 (labeled "G") is disposed over the substrate 42. Typically, the material of the gate 44 is in direct contact with the substrate 42. In the embodiment illustrated in FIG. 4A, S/D diffusion is disposed between each finger of the gate 44.

In the embodiment illustrated in FIG. 4A, a multi-fingered metal layer M1 structure 46 is also disposed over the substrate 42. The M1 structure 46 makes contact with the underlying S/D diffusion areas using multiple M1-to-S/D diffusion contacts, shown with dotted lines to convey the fact that the S/D diffusion contacts are below the metal of the M1 structure 46. In the embodiment illustrated in FIG. 4A, the fingers of the M1 structure 46 occupy every other S/D diffusion area and will be part of a source contact (labeled "S"). The S/D diffusion areas not occupied by the M1 structure 46 are occupied by M1 structures 48 and 50 that will be either part of a drain (labeled "D") or a node A (labeled "A"), respectively. The M1 structures 48 that are part of node D are electrically connected to the underlying S/D diffusion areas via M1-to-S/D diffusion contacts, while the M1 structures 50 that are part of node A are not connected to the underlying S/D diffusion areas. The source S, drain D, and gate G structures are components of a FET, such as the FET switch 38 in FIG. 3B.

FIG. 4B is another top view of the switch and metal capacitor structure 40. For clarity, the S/D diffusion layer is not shown in FIG. 4B. FIG. 4B shows the locations of M2 to M1 contacts that will connect the M1 structures 48 and 50 to the M2 layers.

FIG. 4C is yet another top view of the switch and metal capacitor structure 40, showing an M2 structure 52 that connects the M1 structures 48 shown in FIG. 4B together to form a drain D and an M2 structure 54 that connects the M1 structures 50 shown in FIG. 4B together to form a capacitor terminal A. In the embodiment illustrated in FIG. 4C, the interdigitated M2 structures 52 and 54, along with the M1 layer structures 48 and 50 to which they are respectively connected, form the two plates of a capacitor, such as the capacitor 36 in FIG. 3B. Thus, FIG. 4C illustrates a switch and metal capacitor structure constructed using FET layers only. This structure can be easily implemented using wafer processes that do not have high metal layer counts.

Figure 5A:
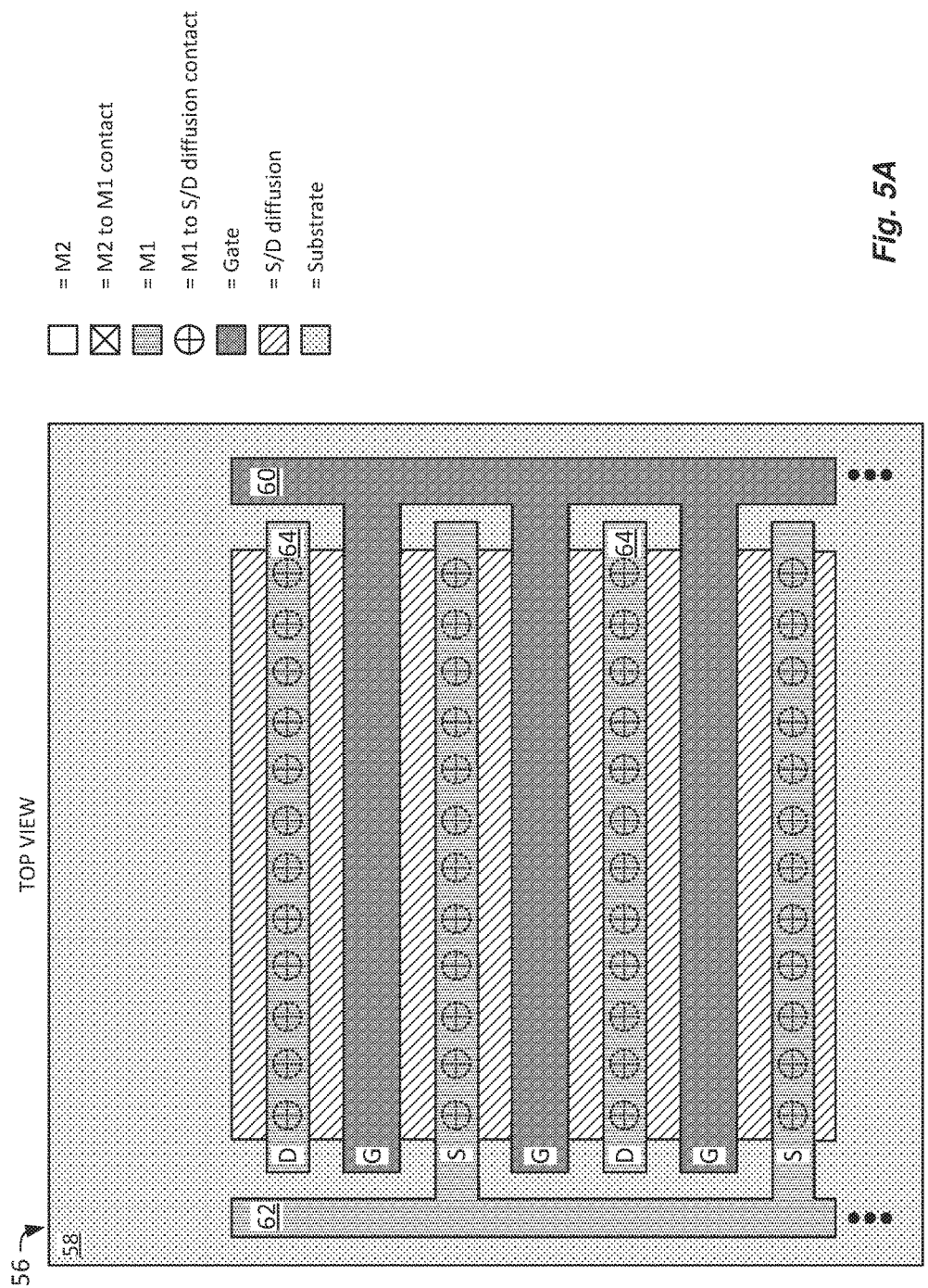

FIGS. 5A and 5B are top views illustrating in detail a switch and metal capacitor structure according to an embodiment of the present disclosure. FIGS. 5A and 5B may also represent the stages of construction that might be used to construct an exemplary AC-coupled switch and metal capacitor structure, the circuit diagram of which is shown in FIG. 3B.

FIG. 5A shows a top view of a portion of an exemplary switch and metal capacitor structure 56 built on a substrate 58. (Alternatively, it could be said that FIG. 5A shows the switch and metal capacitor structure 56, partially constructed.) In one embodiment, the substrate 58 may comprise a doped or undoped semiconductor substrate, such as, but not limited to, Silicon, Gallium Arsenide, or other III-V semiconductor materials.

In the embodiment illustrated in FIG. 5A, a multi-fingered gate 60 (labeled "G") is disposed over the substrate 58. Typically, the material of gate 60 is in direct contact with the substrate 58. In the embodiment illustrated in FIG. 5A, S/D diffusion is disposed between each finger of the gate 60.

In the embodiment illustrated in FIG. 5A, a multi-fingered metal layer M1 structure 62 is also disposed over the substrate 58. The M1 structure 62 makes contact with the S/D diffusion layers using multiple M1-to-S/D diffusion contacts, shown with dotted lines to convey the fact that the S/D diffusion contacts are below the M1 structure 62. In the embodiment illustrated in FIG. 5A, the fingers of the M1 structure 62 occupy every other S/D diffusion area and will be part of a source contact (labeled "S"). The S/D diffusion areas not occupied by the M1 structure 62 are occupied by M1 structures 64 that will be part of a drain (labeled "D"). The M1 structures 64 are electrically connected to the S/D diffusion layer via M1-to-S/D diffusion contacts, shown with dotted lines to convey the fact that the S/D diffusion contacts are below the M1 structures 64. The source S, drain D, and gate G structures are components of a FET, such as the FET switch 38 in FIG. 3B.

FIG. 5B is a top view of a switch and metal capacitor structure 56 according to another embodiment of the present disclosure. For clarity, the S/D diffusion layers and the M1-to-S/D diffusion contacts are not shown in FIG. 5B. In the embodiment illustrated in FIG. 5B, M2 structures 66 (labeled "D") are electrically connected to the M1 structures 64 also labeled "D." An additional M2 structure 68 (labeled "A") surrounds the M2 structures 66 but does not touch the M2 structures 66. In this manner, the two nodes of a capacitor, such as the capacitor 36 in FIG. 3B, are constructed in the metal layer M2, i.e., the M2 structure 68 and the M2 structures 66 form the two plates of a capacitor. The M2 structure 68 can thus be thought of as forming conductive loops that encircle the M2 structures 66. In the embodiment illustrated in FIG. 5B, the M1 structures 64 below and electrically connected to the M2 structures 66 provide additional capacitance, at least where the M1 structures 64 overlap the M2 structure 68.

Figure 6:
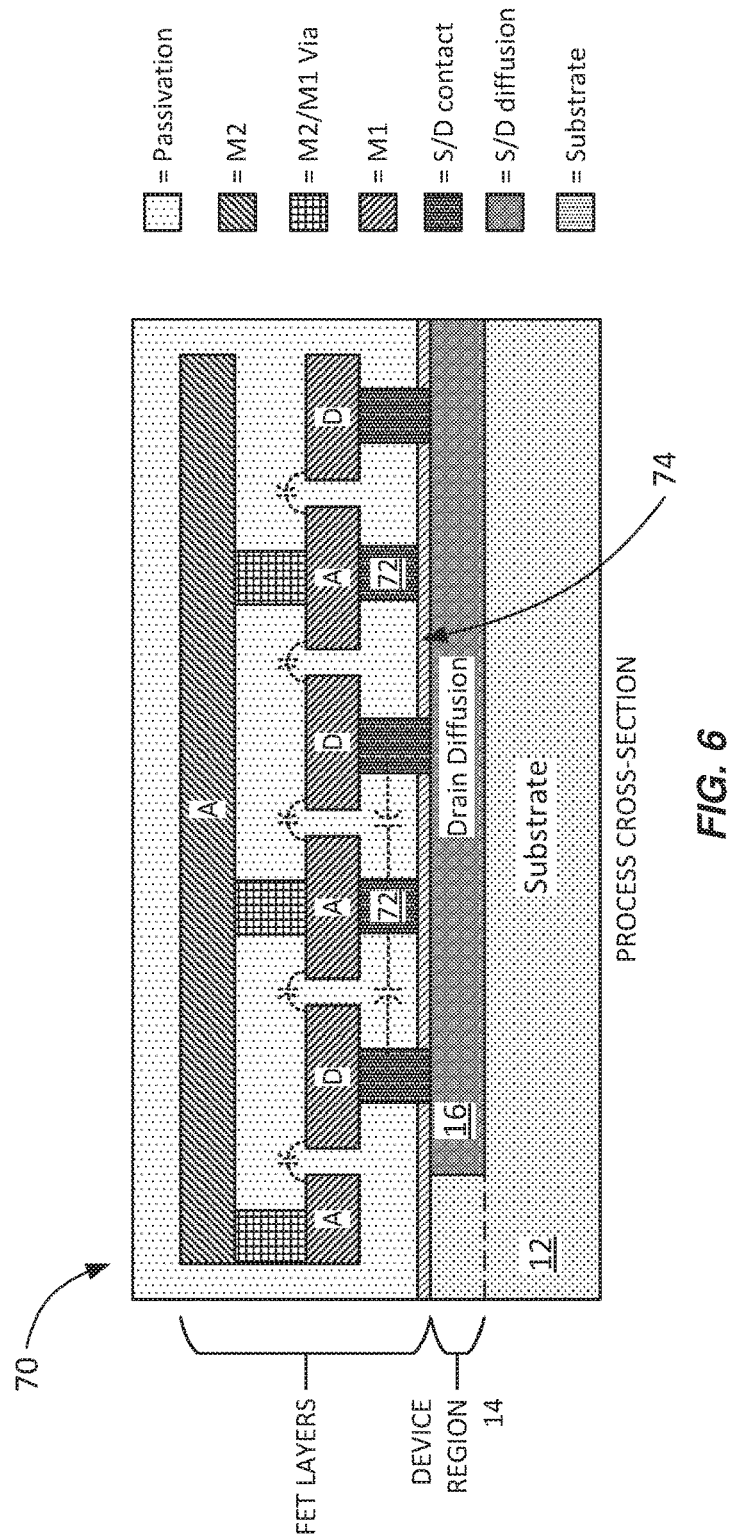
FIG. 6 illustrates a cross-sectional view of an exemplary AC-coupled switch and metal capacitor structure according to another embodiment of the present disclosure.
Figure 7:
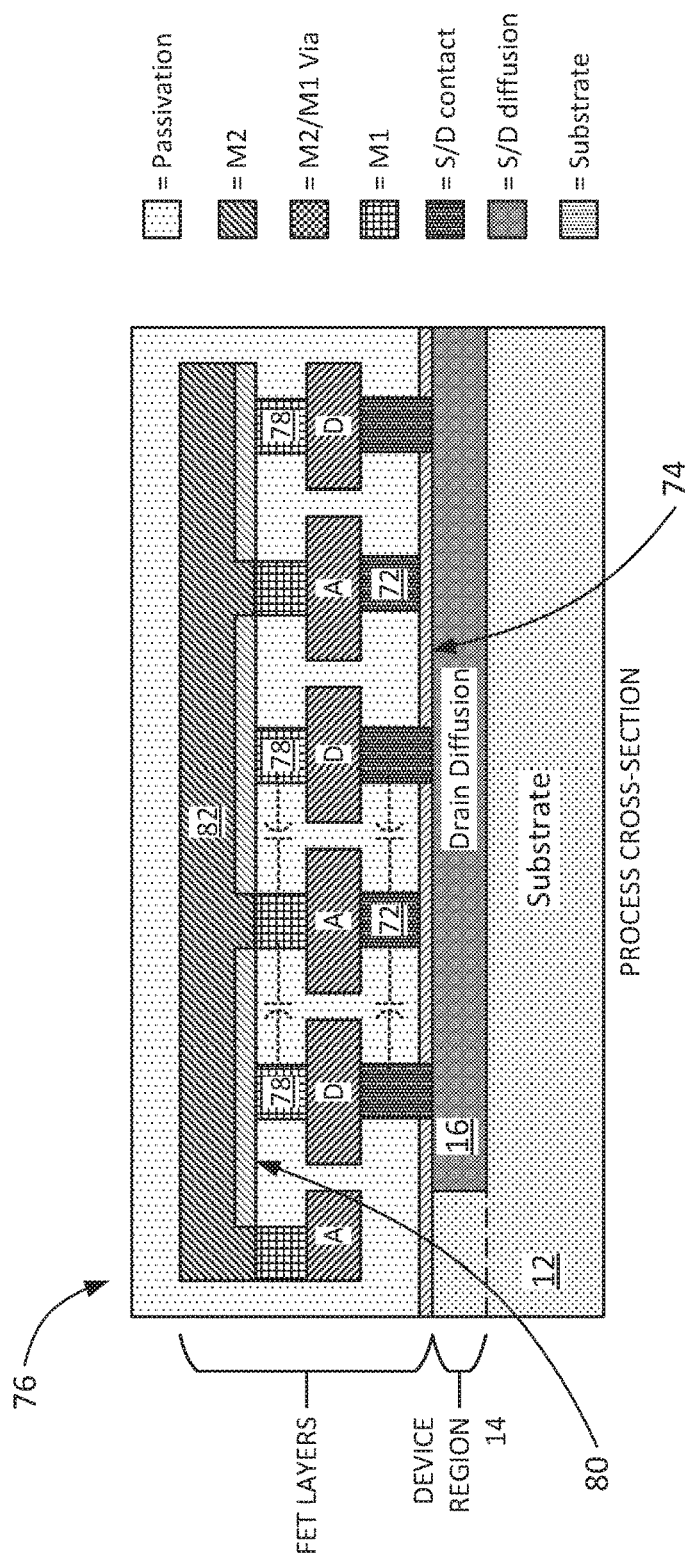
FIG. 7 illustrates a cross-sectional view of an exemplary AC-coupled switch and metal capacitor structure according to another embodiment of the present disclosure.

The embodiments illustrated in FIGS. 4A through 4C and in FIGS. 5A and 5B show example structures in planes parallel with the surface of a wafer, herein referred to as "horizontal" structures, but do not easily show the portions of those structures that are perpendicular to the surface of the wafer, herein referred to as "vertical" structures. FIG. 3 shows the vertical structures according to one embodiment of the present disclosure. FIGS. 6 and 7, below, describe variations on the vertical structures according to other embodiments of the present disclosure.

FIG. 6 illustrates a cross-sectional view 70 of an exemplary switch and metal capacitor structure (referred to herein as simply the "cross-section 70") according to another embodiment of the present disclosure. In the embodiment illustrated in FIG. 6, the cross-section 70 is similar to the cross-section 32 in FIG. 3A, but with the addition of additional structures 72, which increase the vertical span of the "A" plate of the capacitor. In one embodiment, these additional structures 72 comprise S/D contact material, but are insulated from actually touching the S/D diffusion layer by a passivation layer 74. These structures may be referred to as "blind contacts" 72, and can be achieved in several ways. For example, one solution is to have a dual-contact opening etching process: one that goes all the way through the oxide to the diffusion and a second one that takes less time and does not reach the diffusion. When the contact openings are filled with the contact material, some of the contacts 72 will be blind and used only for capacitance density increase. This processing uses additional mask and additional processing steps for the FET metal capacitance structure. Another solution is to have a selecting insulator filling process step or a selecting etching of some insulator filling material step.

FIG. 7 illustrates a cross-sectional view of an exemplary switch and metal capacitor structure 76 (referred to herein as simply "the cross-section 76") according to another embodiment of the present disclosure. In the embodiment illustrated in FIG. 7, the cross-section 76 is similar to the cross-section 70 in FIG. 6, but with the addition of additional structures 78 to further increase the vertical span of the "D" plate of the capacitor. These structures may be referred to as "blind vias" 78, and can be achieved, for example, with a deposition of a thin oxide 80 on top of all the vias 78, followed by an etching of the thin oxide 80 on top of the vias 78 that need to make contact with the upper metal 82. The blind vias 78 keep the thin oxide 80 as a means to isolate from the upper metal 82. Such processing also uses additional mask and processing steps.

Figure 8:
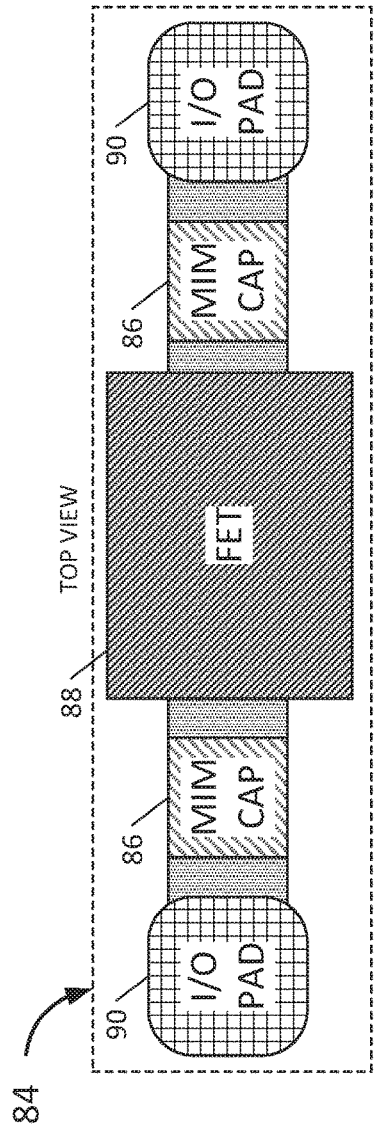
FIG. 8 is a top view of a conventional switch and metal capacitor circuit layout.

FIG. 8 is a top view of a conventional switch (i.e., FET) and metal capacitor circuit layout 84 (referred to herein as simply "the conventional circuit layout 84"). FIG. 8 illustrates the point that in the conventional circuit layout 84 made using conventional wafer process rules, MIM capacitor structures 86 cannot be integrated with a FET structure 88 and therefore must occupy separate areas. Moreover, bonding pads 90 (which may also be referred to as Input/Output (I/O) pads) are not allowed to overlap with the MIM capacitor structures 86.

Figure 9:
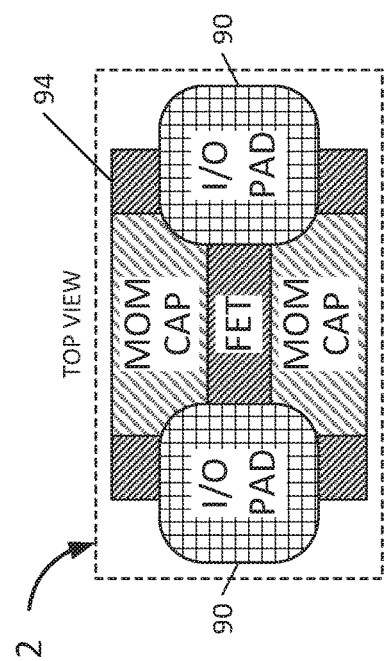
FIG. 9 is a top view of an exemplary switch and metal capacitor circuit layout constructed according to an embodiment of the present disclosure.

FIG. 9 is a top view of an exemplary switch (i.e., FET) and metal capacitor circuit layout 92 (referred to herein as simply "the exemplary circuit layout 92") constructed according to an embodiment of the present disclosure. FIG. 9 is shown for comparison to FIG. 8 and illustrates the point that the exemplary circuit layout 92 according to the present disclosure integrates the MOM capacitor layout with the FET layout (integrated layout 94) and thus occupies less space than their conventional counterparts in FIG. 8. In addition, because the integrated layout 94 is comprised of FET metal layers and not upper metal or routing metal layers, those upper layers are available for use as the bonding pad 90, or else do not contain structures that would overlap with bonding pad metal, with the benefit that the bonding pads 90 can overlap with the integrated layout 94, resulting in an additional, significant reduction in area of the exemplary circuit layout 92 when compared to the conventional circuit layout 84 illustrated in FIG. 8.

The exemplary switch and metal capacitor structures of the present disclosure are helpful in building compact signal multiplexers. Having AC coupling on both ends allows the use of a single FET switch, bringing area and/or insertion loss advantages. We have shown that when the metal capacitance is built into the FET structure, the MIM capacitor so created has capacitance density that is comparable with conventional MOM capacitors that are built on top of FET structures.

Figure 10:
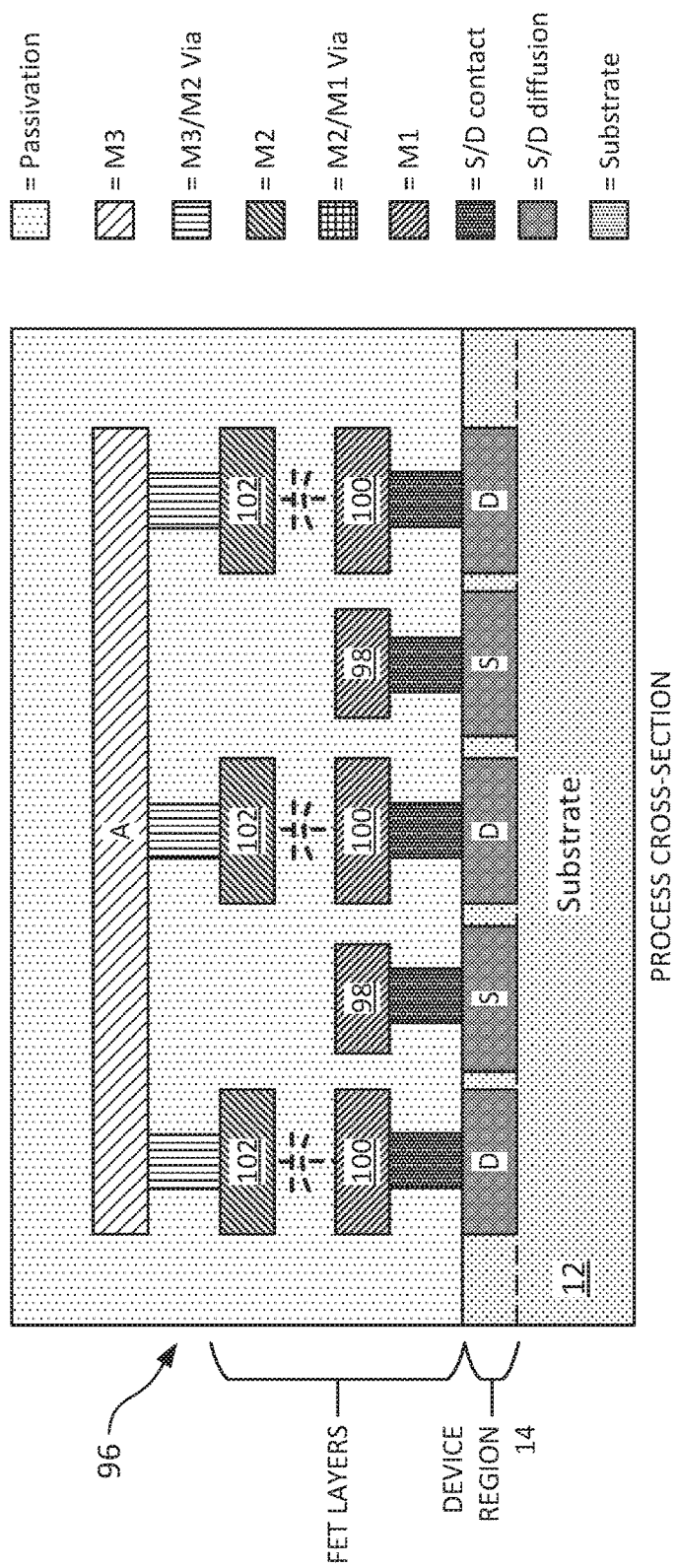
FIG. 10 illustrates a cross-sectional view of an exemplary switch and metal capacitor structure according to another embodiment of the present disclosure.

FIG. 10 illustrates a cross-sectional view 96 of an exemplary switch and metal capacitor structure (referred to herein as simply "the cross-section 96") according to another embodiment of the present disclosure. In the embodiment illustrated in FIG. 10, the cross-section 96 shows a portion of a circuit having a capacitor connected in series with a FET switch. In the embodiment illustrated in FIG. 10, the FET is formed in the device region 14 of the substrate 12. The FET has a plurality of source diffusions (labeled "S") and drain diffusions (labeled "D") within the device region 14. For clarity, the FET's gate structures are not shown.

A plurality of M1 structures 98 form source contacts and a plurality of M1 structures 100 form drain contacts. In the embodiment illustrated in FIG. 10, the M1 structures 100 act as the bottom plate of a capacitor while a plurality of M2 structures 102 form the top plate of the capacitor. In the embodiment illustrated in FIG. 10, the M2 structures 102 are electrically connected together using a higher metal layer, e.g., the M3 layer, but in alternative embodiments, the M2 structures 102 may be electrically connected to each other in the M2 layer, i.e., without requiring the M3 layer as a routing layer. The FET-plus-capacitor structure illustrated in FIG. 10 may also be constructed using nanometer or low-metal-layer processes.

Those skilled in the art will recognize improvements and modifications to the present disclosure. All such improvements and modifications are considered within the scope of the concepts disclosed herein.

What is claimed is:

1. A switch and metal capacitor structure, comprising:
a substrate comprising a device region with a Field Effect Transistor (FET) formed therein, the FET having a source terminal (S) comprising a structure in a first metal layer and a drain terminal (D) comprising a structure in the first metal layer; and
a capacitor comprising a first plate and a second plate, the first plate comprising a structure in a second metal layer, the second metal layer being above the first metal layer, the structure of the first plate being electrically connected to the structure of the drain terminal (D), the second plate comprising a structure in the second metal layer, the structure of the first plate spaced from the structure of the second plate, and the structure of the second plate is not electrically connected to the device region.

2. The switch and metal capacitor structure of claim 1 wherein the first and second metal layers are the metal layers that are closest to the substrate.

3. The switch and metal capacitor structure of claim 1 wherein the structure of the first plate comprises a first plurality of parallel conductors in the second metal layer and the structure of the second plate comprises a second plurality of parallel conductors in the second metal layer interdigitated between the first plurality of parallel conductors in the second metal layer.

4. The switch and metal capacitor structure of claim 3 wherein the structure of the source terminal (S) comprises a third plurality of parallel conductors in the first metal layer.

5. The switch and metal capacitor structure of claim 4 wherein an orientation of the third plurality of parallel conductors is different from an orientation of the first and second pluralities of parallel conductors.

6. The switch and metal capacitor structure of claim 5 wherein the orientation of the third plurality of parallel conductors is essentially perpendicular to the orientation of the first and second pluralities of parallel conductors.

7. The switch and metal capacitor structure of claim 1 wherein the structure of the second plate comprises a conductive loop that surrounds the structure of the first plate.

8. The switch and metal capacitor structure of claim 1 wherein the structure of the second plate comprises a plurality of conductive loops, each loop surrounding a portion of the structure of the first plate, the portions of the structure of the first plate being electrically connected to each other.

9. The switch and metal capacitor structure of claim 1 wherein the structure of the drain terminal (D) further comprises one or more electrically conductive vias that extend above or below the first metal layer but that do not make electrical contact with another conductive layer or the substrate.

10. The switch and metal capacitor structure of claim 1 wherein at least one of the structure of the first plate and the structure of the second plate comprises one or more electrically conductive vias that extend above or below the second metal layer but that do not make electrical contact with another conductive layer or the substrate.

11. The switch and metal capacitor structure of claim 1 wherein at least one of the first and second plates is electrically coupled to a structure in a third metal layer, the third metal layer being above the second metal layer.

12. The switch and metal capacitor structure of claim 1 wherein the first plate is electrically coupled to a structure in a third metal layer, the third metal layer being above the second metal layer, and wherein the second plate is electrically coupled to a structure in the third metal layer.

13. A switch and metal capacitor structure, comprising:
a substrate comprising a device region with a Field Effect Transistor (FET) formed therein, the FET having a source terminal (S) comprising a structure in a first metal layer and a drain terminal (D) comprising a structure in the first metal layer, wherein the source terminal (S) and the drain terminal (D) are above the device region; and a capacitor comprising a first plate and a second plate, the first plate comprising at least a portion of the structure of the drain terminal (D) in the first metal layer and the second plate comprising a structure in a second metal layer, the second metal layer being above the first metal layer, the structure of the second plate spaced from the structure of the drain terminal (D), and the structure of the second plate is not electrically connected to the device region.

14. The switch and metal capacitor structure of claim 13 wherein the first and second metal layers are the metal layers that are closest to the substrate.

15. The switch and metal capacitor structure of claim 13 further comprising a plurality of second plates that include the second plate and wherein the plurality of second plates are electrically connected together.

16. The switch and metal capacitor structure of claim 15 wherein the plurality of second plates are electrically connected together by a third metal layer that is above the second metal layer.

* * * * *